United States Patent
Yamasaki et al.

(10) Patent No.: US 7,288,965 B2
(45) Date of Patent: Oct. 30, 2007

(54) SEMICONDUCTOR DEVICE AND LEVEL CONVERSION CIRCUIT

(75) Inventors: Kyoji Yamasaki, Hyogo (JP); Yasuhiko Tsukikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/642,726

(22) Filed: Dec. 21, 2006

(65) Prior Publication Data

US 2007/0103197 A1    May 10, 2007

Related U.S. Application Data

(63) Continuation of application No. 10/947,257, filed on Sep. 23, 2004, now Pat. No. 7,161,387.

(30) Foreign Application Priority Data

Sep. 26, 2003    (JP)    ............................. 2003-335759

(51) Int. Cl.
*H03K 19/0175*    (2006.01)
(52) U.S. Cl. .......................................... 326/81; 326/80
(58) Field of Classification Search .................. 326/63, 326/68, 80, 81, 83
See application file for complete search history.

(56) References Cited

U.S. PATENT DOCUMENTS

| | | | |
|---|---|---|---|
| 6,774,696 B2 | 8/2004 | Clark et al. | |
| 6,781,413 B2 | 8/2004 | Kihara et al. | |
| 2002/0153934 A1* | 10/2002 | Yoon | ......................... 327/333 |

FOREIGN PATENT DOCUMENTS

| | | |
|---|---|---|
| JP | 7-106946 | 4/1996 |
| JP | 2001-298356 | 10/2001 |

* cited by examiner

*Primary Examiner*—Daniel Chang
(74) *Attorney, Agent, or Firm*—McDermott Will & Emery LLP

(57) ABSTRACT

A level conversion circuit that converts a signal outputted from a second internal circuit receiving a first power supply voltage to a signal of a level of a second power supply voltage having a voltage level different than the first power supply voltage to apply its output signal to a first internal circuit, is provided with a mechanism for cutting off a path passing a through current in the level conversion circuit when the first power supply voltage is cut off.

2 Claims, 10 Drawing Sheets

W/L
PQ1,PQ2: 20/3
NQ1,NQ3: 80/3
NQ2,NQ4: 33/100

SEMICONDUCTOR DEVICE AND LEVEL CONVERSION CIRCUIT

RELATED APPLICATION

This application is a continuation of application Ser. No. 10/947,257, filed Sep. 23, 2004 now U.S. Pat. No. 7,161,387, which claims priority to Japanese Patent Applications 2003-335759(P), filed on Sep. 26, 2003, which are all incorporated herein by reference.

BACKGROUND OF THE INVENTION

1. Field of the Invention

The present invention relates generally to semiconductor devices utilizing a plurality of internal power supply voltages at different levels and particularly to semiconductor devices and level conversion circuits having a function of converting a level of an internal signal. More specifically, the present invention relates to configurations for providing a reduced current consumption and preventing an erroneous circuit operation in a certain mode of operation such as a data holding mode.

2. Description of the Background Art

In a boundary region between circuits operating with supply voltages at different levels, a level conversion circuit is generally used to accurately turn on and off a transistor. In a MOS circuit with a MOS transistor (an insulated gate field effect transistor) being a component, in particular, such a level conversion circuit is used in a region transferring a signal from a circuit using a lower voltage as an operating power supply voltage to a circuit using a higher voltage as an operating power supply voltage, so as to set a gate—source voltage of the MOS transistor accurately to or below its threshold voltage.

This level conversion circuit converts a signal having a first logic level of a first power supply voltage level to a signal having the first logic level of a second power supply voltage level higher than the first power supply voltage. Examples of such a level conversion circuit are shown in Japanese Patent Laying-Open Nos. 2001-298356and 7-106946. These prior art documents describe as the level conversion circuits a latch-type level shift circuit, in which a configuration is shown to control turning on/off of a pull-up transistor in a level conversion portion (a latch portion) in accordance with a level-converted signal, to reduce a through current flowing upon transition of a data signal.

One such MOS circuit device utilizing internal voltages at a plurality of different voltage levels is a dynamic random access memory (DRAM). In such DRAM, a plurality of internal voltages having different voltage levels are generated from an external power supply voltage and an inputting and outputting power supply voltage for an interface portion is externally supplied. The internal voltages include an array power supply voltage Vdds supplied to a memory cell array portion, a peripheral power supply voltage Vddp supplied to peripheral circuitry, and a high voltage Vpp transmitted on a selected word line in the memory array. For example, if the external power supply voltage is 3.0V, peripheral power supply voltage Vddp is, for example, 2.5V to allow the peripheral circuitry to operate at high speed. Array power supply voltage Vdds is, for example, 2.0V to insure a dielectric breakdown of a memory cell capacitor and also to reduce an internal signal amplitude to reduce charging and discharging current at a bit line and others.

Furthermore, a selected word line is supplied with high voltage Vpp at, for example, 3.6V to ensure that data at the array power supply voltage level is written without loss of a threshold voltage of an access transistor in a memory cell and also transport electric charges rapidly between a bit line and the memory cell capacitor via the access transistor.

A processing system such as a server including such a DRAM employs a large number of semiconductor devices. Accordingly, to reduce the current consumption in an entire system, it is an important factor to reduce current consumption in the semiconductor devices. Furthermore, for applications to mobile equipment and the like, a battery is used as a power supply and to extend the life time of the battery, an internal semiconductor device is required to reduced power consumption.

When a DRAM or a similar memory is not accessed and data is simply held in the DRAM, a power down mode is normally set. In the power down mode, power supply to an input/output circuit other than a circuit receiving a command instructing an operation mode is interrupted, and internal to the DRAM a refresh operation is performed at prescribed periods to hold data.

To furthermore reduce power consumption, a deep power down mode is set to stop generation of internal power supply voltage. In the deep power down mode, if generation of peripheral power supply voltage Vddp is stopped, a control circuit receiving the peripheral power supply voltage as an operating power supply voltage to generate an internal control signal outputs a control signal having an uncertain voltage level. If such control signal is used to control an operation of a circuit generating the high voltage Vpp, a level conversion circuit is employed for converting a signal having an amplitude of the peripheral power supply voltage Vddp level to a signal having an amplitude of the high voltage Vpp level. For a circuit generating a control signal of the external power supply voltage Vddq level from a signal of the peripheral power supply voltage Vddp level, similarly a level conversion circuit is employed.

For such level conversion circuit, a latch-type shift circuit is typically used, as described previously; If an input signal to such latch-type level shift circuit has an uncertain voltage level to have the voltage level electrically floated up, a through current flows via one of cross-coupled P-channel MOS transistors through a MOS transistor receiving this uncertain signal. Thus, in this level conversion circuit portion in the deep power down mode, a signal in the uncertain state causes a through current to flow and current consumption cannot be reduced. Furthermore, such a through current may cause a latch state to be inverted and a circuit at a subsequent stage may erroneously operate.

In the level shift circuits described in the above described prior art documents, a through current flowing upon signal transition is reduced by feeding back a level-converted signal to cut off a path passing the through current upon the signal transition. However, with this configuration, if in the deep power down mode, the power supply to the circuit generating an input signal is stopped and the input signal enters an uncertain state, the input signal may electrically float up in voltage level to form a path causing a through current flow, resulting in disadvantageously increased power consumption.

The prior art documents intends to simply reduce a through current flowing upon signal transition to reduce the power consumption and to change a signal at high speed to perform a level conversion operation. These documents, however, fail to give any consideration to a disadvantageous through current in an operation mode, such as the deep power down mode, in which supply of a power supply voltage to a circuit supplying an input signal is stopped.

SUMMARY OF THE INVENTION

An object of the present invention is to provide a level-conversion circuit ensuring that a through current is reduced for an uncertain state of an input signal, and a semiconductor device employing the same.

Another object of the present invention is to provide a level conversion circuit normally operating even under interrupted supply of a part of a plurality of internal power supply voltages, and a semiconductor device employing the same.

A semiconductor device according to a first aspect of the present invention includes: a level conversion circuit for converting an internal signal having a first logic level at a first power supply voltage level to a level-converted signal having the first logic level at a second power supply voltage level. The level conversion circuit includes a circuit for cutting off a path passing a through current, in a specific mode of operation, between a node supplying the second power supply voltage and a node supplying a third power supply voltage different in level from the first and second power supply voltages.

The semiconductor device according to the first aspect of the present invention further includes a power supply circuit for interrupting supply of the first power supply voltage and for supplying the second power supply voltage in the specific mode of operation.

A level conversion circuit according to a second aspect of the present invention includes: an inverter receiving a first power supply voltage as an operating power supply voltage to invert an internal signal; a first insulated gate field effect transistor of a first conductivity type connected between a power supply node supplying a second power supply voltage and a first internal node and having its gate connected to a second internal node; a second insulated gate field effect transistor of the first conductivity type connected between a power supply node supplying the second power supply voltage and the second internal node and having its gate connected to the first internal node; and first and second insulated gate field effect transistors of a second conductivity type connected in parallel between the first internal node and a reference power supply node supplying a third power supply voltage. The first insulated gate field effect transistor of the second conductivity type has its gate connected to the second internal node, and the second insulated gate field effect transistor of the second conductivity type receives the internal signal at its gate.

The level conversion circuit according to the second aspect of the present invention further includes third and fourth insulated gate field effect transistors of the second conductivity type connected in parallel between the second internal node and the reference power supply node. The third insulated gate field effect transistor of the second conductivity type has its gate connected to the first internal node and the fourth insulated gate field effect transistor of the second conductivity type receives, at its gate, a signal output from the inverter.

The level conversion circuit according to the second aspect of the present invention further includes: a fifth insulated gate field effect transistor of the second conductivity type according to a voltage of the first internal node for selectively fixing the gate of the second insulated gate field effect transistor of the second conductivity type to the third power supply voltage's level; and a sixth insulated gate field effect transistor of the second conductivity type according to a voltage of the second internal node for selectively fixing the gate of the fourth insulated gate field effect transistor of the second conductivity type to the third power supply voltage level.

A level conversion circuit according to a third aspect of the present invention includes: an inverter receiving a first power supply voltage as an operating power supply voltage to invert an internal signal; first and second insulated gate field effect transistors of a first conductivity type connected in series between a power supply node supplying a second power supply voltage and a first internal node. The first insulated gate field effect transistor has its gate connected to a second internal node, and the second insulated gate field effect transistor receives the internal signal at its gate.

The level conversion circuit according to the third aspect of the present invention further includes third and fourth insulated gate field effect transistors of the first conductivity type connected in series between a power supply node supplying the second power supply voltage and the second internal node. The third insulated gate field effect transistor has its gate connected to the first internal node, and the fourth insulated gate field effect transistor receives, at its gate, a signal outputted from the inverter.

The level conversion circuit according to the third aspect of the present invention further includes: first and second insulated gate field effect transistors of a second conductivity type connected in parallel between the first internal node and a reference power supply node supplying a third power supply voltage; and third and fourth insulated gate field effect transistors of the second conductivity type connected in parallel between the second internal node and the reference power supply node. The first insulated gate field effect transistor receives the internal signal at its gate, and the second insulated gate field effect transistor has its gate connected to the second internal node. The third insulated gate field effect transistor receives, at its gate, a signal outputted from the inverter, and the fourth insulated gate field effect transistor has its gate connected to the first internal node.

In the semiconductor device according to the first aspect, in a specific mode of operation of interrupting supply of the first power supply voltage, the level conversion circuit has a path of a through current cut off to ensure that the through current is suppressed even when the input signal to the level converting circuit enters an uncertain state during interruption of supply of the first power supply voltage.

In the level conversion circuit according to the second aspect, the first and second insulated gate field effect transistors of the first conductivity type and first and second insulated gate field effect transistors of the second conductivity type form a CMOS inverter latch, and a level-converted output signal is in a latched state. Second and fourth insulated gate field effect transistors of the second conductivity type function as assisting latching transistors for the CMOS inverters. Thus, even when the first or the third insulated field effect transistor turns conductive in the uncertain state of an input signal, the latching state of the CMOS inverters does not alter to maintain the latching state even when a through current path is formed, to prevent an erroneous operation of the level converting circuit. Furthermore, the fifth and sixth insulated gate filed effect transistors allow the output voltage to be maintained in a fixed manner to reliably maintain the latching state of the output signal.

In the level conversion circuit according to the third aspect, second and fourth insulated gate field effect transistors of the first conductivity type have the conductance changed for an uncertain input signal in a direction of reducing the through current, resulting in reduced through current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
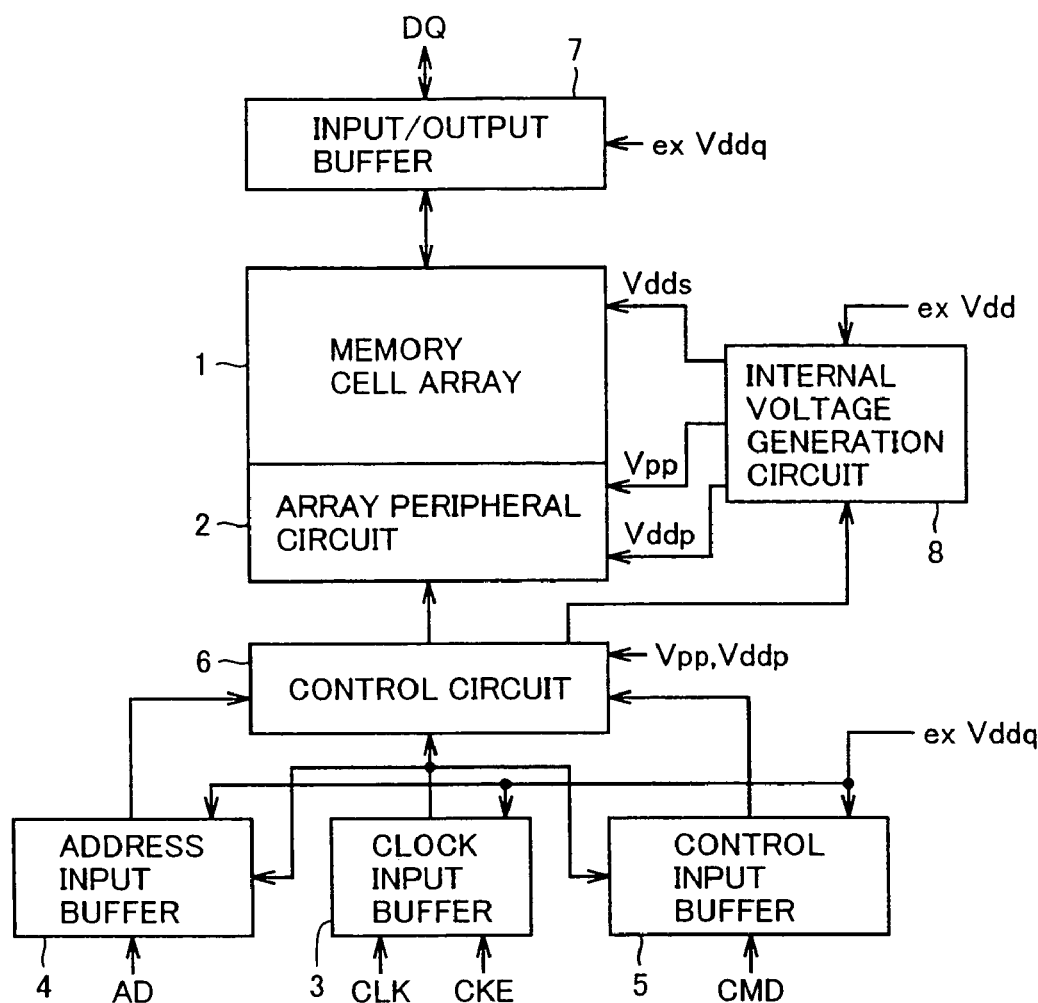
FIG. 1 shows an example of a configuration of a semiconductor device to which the present invention is applied.

FIG. 1 schematically shows a configuration of an entire semiconductor device including a level conversion circuit according to the present invention. FIG. 1 shows the semiconductor device configured of a semiconductor memory device (synchronous DRAM (SDRAM)), by way of example.

In FIG. 1, the semiconductor device according to the present invention includes a memory cell array 1 having a plurality of memory cells arranged in rows and columns, an array peripheral circuit 2 for selecting a memory cell of memory cell array 1 and reading/writing internal data, a clock input buffer 3 for receiving an external clock signal CLK and a clock enable signal CKE setting validness/invalidness of an internal clock signal to generate an internal clock signal, an address input buffer 4 for taking in an external address signal AD to generate an internal address signal in accordance with the input clock signal outputted from clock input buffer 3, a control input buffer 5 for taking in an external command CMD to generate an internal command in accordance with the internal clock signal outputted from clock input buffer 3, and a control circuit 6 for decoding the internal command received from control input buffer 5 in synchronization with the internal clock signal outputted from clock input buffer 3 to generate a signal controlling various internal operations in accordance with a designated mode of operation.

Control circuit 6 also receives an internal address signal outputted from address input buffer 4. This is because a particular address bit is used to designate a mode of operation in some case, and in other case, the memory cell array is configured into a plurality of banks and control circuit 6 activates a designated bank in accordance with a bank address included in address signal AD.

Control input buffer 5 receives command CMD, which may be a decoded operation mode instructing signal, or may be provided in the form of a combination of a plurality of control signals to designate a mode of operation in accordance with a combination of logic levels at an edge of a clock signal.

The semiconductor device further includes an input/output buffer 7 for communicating data between an external and a memory cell selected in memory cell array 1, and an internal voltage generation circuit 8 for generating various internal voltages in accordance with an external power supply voltage exVdd.

Internal voltage generation circuit 8 includes an internal power supply circuit for generating an internal power supply voltage and internally down-converts external power supply voltage exVdd for example of 3.0V to generate array power supply voltage Vdds of 2.0V, for example, peripheral power supply voltage Vddp of a level of 2.5V, for example 2.5V, and in addition, boosts external power supply voltage exVdd to generate high voltage Vpp of a level of, for example, 3.6V. Array power supply voltage Vdds is supplied to memory cell array 1 and is used as an operating power supply voltage for sense amplifiers arranged in memory cell array 1. Peripheral power supply voltage Vddp and high voltage Vpp are applied to the array peripheral circuit 2 peripheral to the array and to control circuit 6. Input buffers 3-5 and input/output buffer 7 serving as an interface with an external receive a dedicated interface power supply voltage exvddq. Interface power supply voltage exvddq may be the same in voltage level as external power supply voltage exVdd or may have its voltage level set in accordance with the interface used.

As shown in FIG. 1, the semiconductor device employs a variety of internal voltages having different voltage levels. Accordingly, in a boundary region of the internal voltages, it is necessary to convert a signal level for accurately controlling on/off of a MOS transistor.

Figure 2:
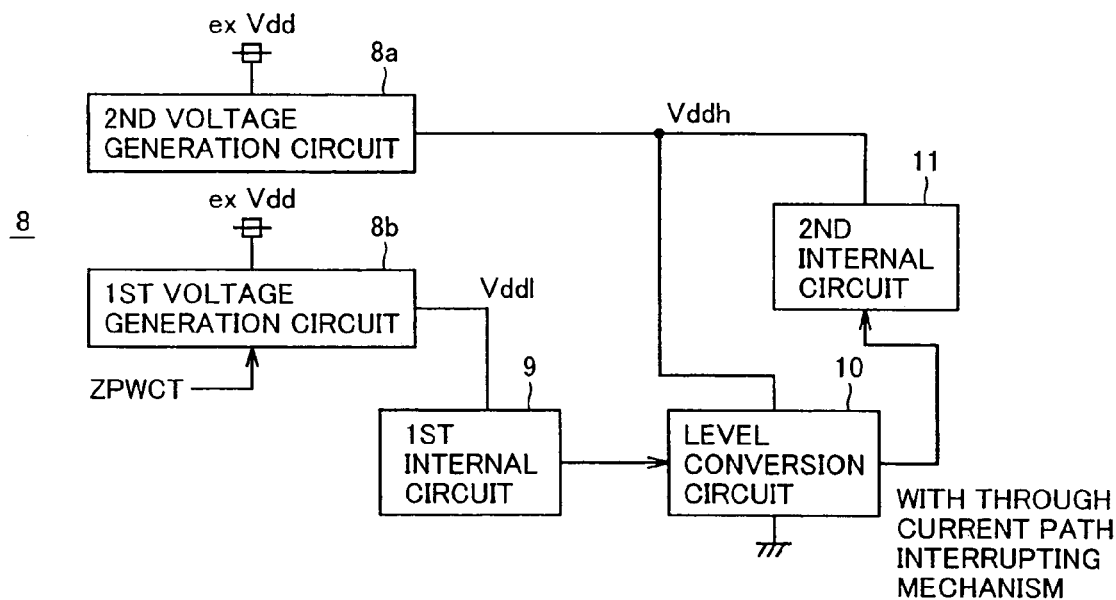
FIG. 2 schematically shows a configuration in principle of a semiconductor device according to the present invention.

FIG. 2 schematically shows a configuration of the voltage boundary region. As shown in FIG. 2, internal voltage generation circuit 8 includes a second voltage generation circuit 8a for generating a second internal voltage Vddh from external power supply voltage exVdd, and a first voltage generation circuit 8b for generating a first internal voltage Vddl from external power supply voltage exVdd when active. The second internal voltage Vddh has a voltage level higher than the first internal voltage Vddl. The second voltage generation circuit 8a normally operates to generate the second internal voltage Vddh from external power supply voltage exVdd. The first voltage generation circuit 8b has its voltage generation operation stopped when a power cut instructing signal ZPWCT is active, and the first voltage generation circuit 8b is activated in response to power cut instructing signal ZPWCT being inactive, to generate the first internal voltage Vddl. The first and second voltage generation circuits 8b and 8a are each configured, for example, of an internal voltage down converter (VDC).

Second internal voltage Vddh is applied as an operating power supply voltage to the second internal circuit 11 and the first internal voltage Vddl is supplied as an operating power supply voltage to the first internal circuit 9. When the operation of the second internal circuit 11 is controlled in accordance with a signal outputted from the first internal circuit 9, the signal outputted from the first internal circuit 9 is level-converted by level conversion circuit 10 into a signal of the second internal voltage Vddh level and then applied to the second internal circuit 11. When power cut instructing signal ZPWCT is activated, level conversion circuit 10 is associated with the following possibility in operation: generation of the first internal voltage Vddl is stopped, the output signal of the first internal circuit 9 enters an uncertain state, and a through current flows. Therefore, level conversion circuit 10 is provided with a mechanism for cutting off a path passing a through current to a ground node supplying a third voltage, or a ground voltage, from the second internal voltage Vddh when power cut instructing signal ZPWCT is activated.

The mechanism provided to level conversion circuit 10 for cutting off the path of a through current can reduce current consumption when power cut instructing signal ZPWCT is active, and the mechanism also allows the internal state of level conversion circuit 10 to be maintained to prevent the second internal circuit 11 from performing an erroneous operation.

It is noted that power cut instructing signal ZPWCT is generated from control circuit 6 shown in FIG. 1. A portion for generating the power cut instructing signal in control circuit 6 is normally supplied with an operating power supply voltage, to control an operation in the power cut mode even when power is cut off.

Furthermore, in the configuration shown in FIG. 2, the first internal voltage Vddl may be higher than the second internal voltage Vddh. Level conversion circuit 10 converts a signal of the Vddl amplitude to a signal of an amplitude of the Vddh level. For such circuit configuration, a through current path cutting off mechanism is provided to prevent the input signal to the second internal circuit 11 from entering an uncertain state and suppressing the increase in current consumption in the power cut mode.

Figure 3:
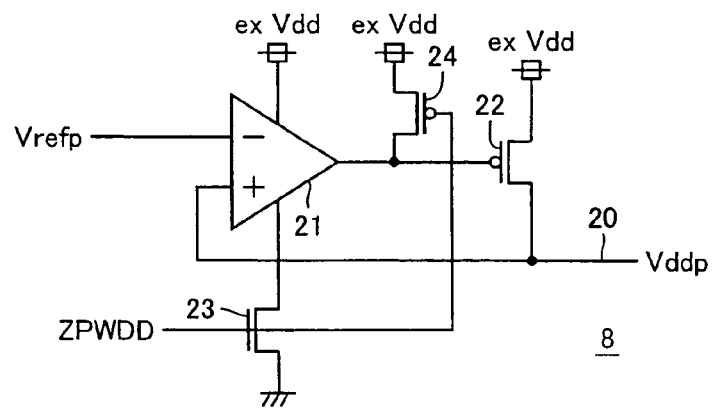
FIG. 3 shows an example of a configuration of a peripheral power supply voltage generation circuit included in the internal voltage generation circuit shown in FIG. 1.

FIG. 3 shows a specific configuration of the first voltage generation circuit 8b shown in FIG. 2. In FIG. 3, peripheral power supply voltage Vddp is generated as the first internal voltage Vddl. The second internal voltage corresponds to external power supply voltage exVdd. Accordingly, the second voltage generation circuit 8a shown in FIG. 2 corresponds to an external power supply line transmitting external power supply voltage exVdd.

In FIG. 3, the peripheral power supply voltage generation circuit includes a comparison circuit 21 for comparing peripheral power supply voltage Vddp on a peripheral power supply line 29 with a reference voltage Vrefp when made active, a current drive transistor 22 formed of a P channel MOS transistor, for supplying a current from an external power supply node to peripheral power supply line 20 in response to a signal outputted from comparison circuit 21, an activation transistor 23 responsive to a deep power down mode instructing signal ZPWDD (corresponding to the power cut instructing signal), for selectively activating comparison circuit 21, and a P channel MOS transistor 24 responsive to the deep power down mode instructing signal ZPWDD, for setting an output node of comparison circuit 21 to the external power supply voltage ExVdd level.

Comparison circuit 21 receives external power supply voltage exVdd as an operating power supply voltage. When peripheral power supply voltage Vddp is generated, deep power down mode instructing signal ZPWDD is at an H level (the external power supply voltage level) or a logically high level, MOS transistor 23 is in a conductive state, and MOS transistor 24 is in a non-conductive state. In this state, comparison circuit 21 outputs a signal corresponding to a difference between peripheral power supply voltage Vddp and reference voltage Vref onto a gate of current drive transistor 22 and in response, current drive transistor 22 has its driving current amount adjusted to adjust the peripheral power supply voltage Vpp voltage level. In the configuration shown in FIG. 3, peripheral power supply voltage Vddp has its voltage level adjusted to be equal to that of reference voltage Vref.

In the deep power down mode, deep power down mode instructing signal ZPWDD is at an L level or logical low level, MOS transistor 23 is in a non-conductive state, and MOS transistor 24 is conductive. In comparison circuit 21, a path of an operating current is cut off, a comparison operation is inactivated, and its output node is fixed by MOS transistor 24 to the external power supply voltage ExVdd level and in response, current drive transistor 22 is kept off. The generation of peripheral power supply voltage Vddp is thus stopped in the deep power down mode.

Hereinafter, a deep power down mode, in which the generation of peripheral power supply voltage Vddp is stopped, will be considered specifically as a specific example of the power cut mode. However, this mode of operation can be any mode in which the generation of an internal voltage is stopped, and it is not particularly limited to the deep power down mode.

Figure 4:
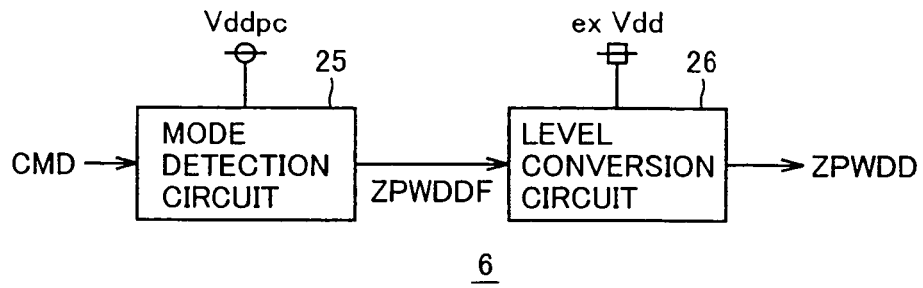
FIG. 4 shows an example of a configuration of a portion for generating a deep power down mode signal shown in FIG. 3.

FIG. 4 schematically shows a configuration of a portion for generating the deep power down mode instructing signal ZPWDD shown in FIG. 3. In FIG. 4, the deep power down mode instructing signal generation portion includes a mode detection circuit 25 for detecting the deep power down mode in accordance with an external command CMD, and a level conversion circuit 26 receiving a signal ZPWDDF from mode detection circuit 25 to convert the received signal to a signal of an amplitude of the external power supply voltage exVdd level, to generate deep power down mode instructing signal ZPWDD.

Mode detection circuit 25 and level conversion circuit 26 are included in control circuit 6 shown in FIG. 1.

Mode detection circuit 25 normally receives a controlling, peripheral power supply voltage Vddpc and operates even in the deep power down mode to normally monitor command CMD so as to accept a command such as a deep power down mode exit. As command CMD supplied to mode detection circuit 25, a dedicated deep power down mode instructing signal may be decoded to be applied, or a plurality of control signals and a particular address bit are combined to designate entry and exit of the deep power down mode.

In FIG. 4, the deep power down mode instructing signal generation portion in control circuit 6, mode detection circuit 25 is normally supplied with the controlling, peripheral power supply voltage Vddpc to prevent the signal ZPWDDF outputted from mode detection circuit 25 from entering an uncertain state in the power down mode, and level conversion circuit 26 can be implemented by a general latch-type level shift circuit.

Figure 5:
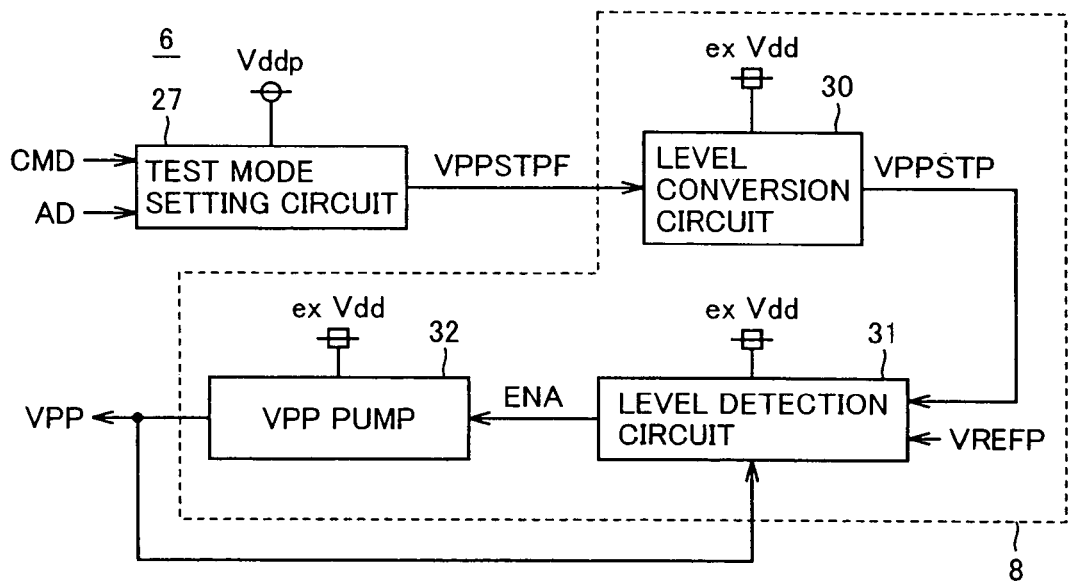
FIG. 5 schematically shows a configuration of a main portion of a semiconductor device according to a first embodiment of the present invention.

FIG. 5 shows a specific configuration of the first and second internal circuits 9 and 11 shown in FIG. 2. In FIG. 5, control circuit 6 includes a test mode setting circuit 27 receiving command CMD and a particular bit of address signal AD to generate a test mode setting signal VPPSTPF. Test mode setting circuit 27 is supplied with peripheral power supply voltage Vddp that is cut off in the deep power down mode. Test mode setting signal VPPSTPF sets a test mode of stopping the generation of high voltage VPP. In this test mode, a word line voltage boosting operation is stopped, and a test of data holding characteristics of the memory cells or a test of a leakage current during a standby state is performed.

Internal voltage generation circuit 8 shown in FIG. 1 includes a level conversion circuit 30 receiving the test mode setting signal VPPSTPF from test mode setting circuit 27 to convert the received signal into a signal VPPSTP of the external power supply voltage exVdd level, a level detection circuit 31 selectively activated in response to test mode setting signal VPPSTP outputted from level conversion circuit 30 to compare high voltage VPP with reference voltage VREFP to generate an enable signal ENA in accordance with a result of the comparison, and a VPP pump 32 responsive to enable signal ENA outputted from level detection circuit 31, for selectively performing a charge pumping operation to generate high voltage VPP. Level detection circuit 31 corresponds to the second internal circuit 11 shown in FIG. 2.

Level detection circuit 31 has a configuration similar to the peripheral power supply voltage generation circuit shown in FIG. 3 and is activated in response to test mode setting signal VPPSTP being inactive, for detecting a level difference between reference voltage VREFP and a divided voltage of high voltage VPP to selectively activate enable signal ENA. VPP pump 32 stops the pumping operation when high voltage VPP is higher than a voltage level determined by reference voltage VREFP and performs the pumping operation in response to enable signal ENA when high voltage VPP is lower than a voltage level defined by reference voltage VREFP, to increase the high voltage VPP level.

In the configuration shown in FIG. 5, test mode setting circuit 27 is supplied with peripheral power supply voltage Vddp that is cut off in the deep power down mode. Accordingly, test mode setting signal VPPSTPF has an uncertain voltage level in the deep power down mode. However, in level conversion circuit 30, with a through current path cutting off mechanism being provided as previously shown in FIG. 2, the through current is suppressed while level-converted test mode setting signal VPPSTP is maintained precisely at a prescribed voltage level.

Figure 6:
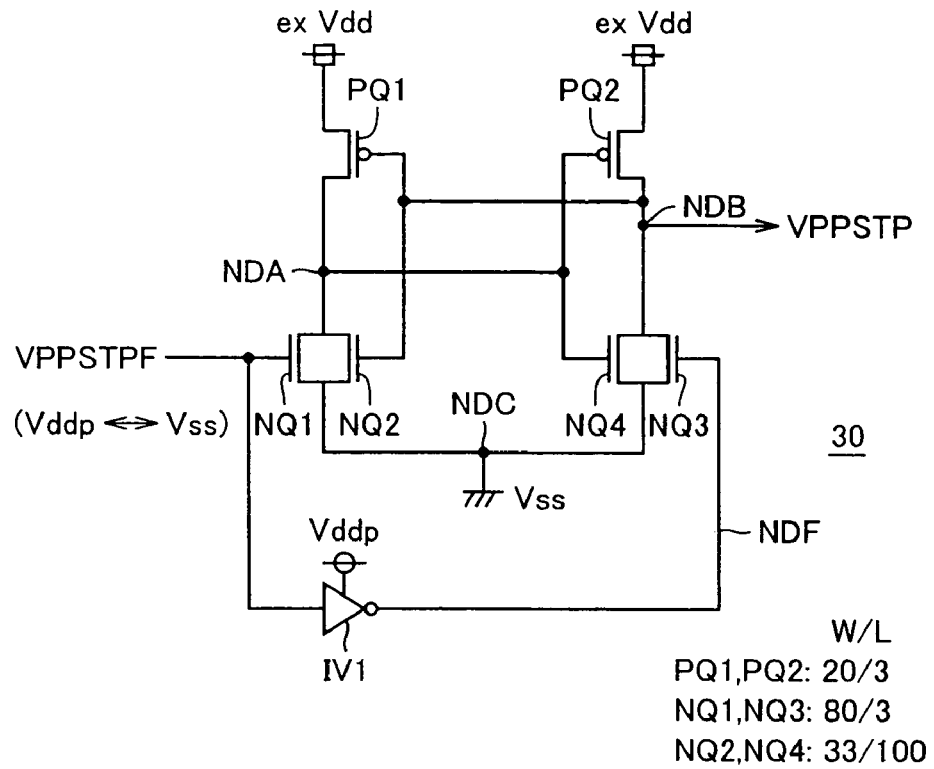
FIG. 6 shows an example of a configuration of a level conversion circuit shown in FIG. 5.

FIG. 6 shows an exemplary configuration of level conversion circuit 30 shown in FIG. 5. In FIG. 6, level conversion circuit 30 includes a P channel MOS transistor PQ1 connected between a power supply node receiving the external power supply voltage exVdd and an internal node NDA and having its gate connected to an internal node NDB, and N channel MOS transistors NQ1 and NQ2 connected in parallel between internal node NDA and a ground node NDC receiving a ground voltage Vss. MOS transistor NQ1 receives a test mode setting signal (hereinafter referred to as an "input signal") VPPSTPF at its gate and N channel MOS transistor NQ2 has its gate connected to internal node NDB.

Level conversion circuit 30 further includes an inverter IV1 receiving input signal VPPSTPF, a P channel MOS transistor PQ2 connected between external power supply node and internal node NDB and having its gate connected to internal node NDA, and N channel MOS transistors NQ3 and NQ4 connected in parallel between internal node NDB and ground node NDC. Inverter IV1 receives peripheral power supply voltage Vddp as an operating power supply voltage, to invert input signal VPPSTPF onto the gate of N channel MOS transistor NQ3. N channel MOS transistor NQ4 has its gate connected to internal node NDA.

MOS transistors PQ1 and NQ2 form a first CMOS inverter and MOS transistors PQ2 and NQ4 form a second CMOS inverter. The first and second CMOS inverters have their inputs and outputs cross-coupled to form an inverter latch.

MOS transistors NQ1 and NQ3 have a ratio between a channel length L and a channel width W, i.e., W/L set to 80/3, for example, MOS transistors PQ1 and PQ2 have a ratio between channel length and channel width, W/L, set to, for example 20/3, and MOS transistors NQ2 and NQ4 each have a channel width to channel length ratio W/L set to 33/100.

Thus, MOS transistors NQ2 and NQ4 are the smallest in current driving capability, MOS transistors NQ1 and NQ3 are the largest in current driving capability, and in accordance with input signal VPPSTPF and a signal outputted from inverter IV1, internal nodes NDA and NDB have their voltage levels changed at high speed. MOS transistors PQ1 and PQ2 pull up and latch the voltage levels of the internal nodes NDA and NDB. The latch circuit formed by MOS transistors PQ1 and PQ2 has a relatively small latching capability and has its latching state inverted in accordance with the drive current by MOS transistors NQ1 and NQ2. By MOS transistors NQ2 and NQ4, the voltage levels of internal node NDA and NDB are maintained when input signal VPPSTPF is uncertain. A latch circuit for maintaining the voltage levels of internal nodes NDA and NDB when the input signal is uncertain is simply provided and therefore, the current driving capability of the latch circuit is made sufficiently small.

In the configuration of level conversion circuit 30 shown in FIG. 6, input signal VPPSTPF alters between peripheral power supply voltage Vddp and ground voltage Vss. In a normal mode of operation with peripheral power supply voltage Vddp being supplied, when input signal VPPSTPF is at H level, which corresponds to the first logic level and is the peripheral power supply voltage Vddp level, MOS transistor NQ1 is conductive and MOS transistor NQ3 is non-conductive. Accordingly, node NDA is discharged, MOS transistor PQ2 increases in conductance, and node NDB rises in voltage level. As internal node NDB rises in voltage level, MOS transistor PQ1 decreases in conductance and MOS transistor NQ2 increases in conductance, and node NDA is rapidly discharged to the ground voltage level. Furthermore, as internal node NDA lowers in voltage level, MOS transistor NQ4 decreases in conductance, MOS transistor PQ2 increases in conductance to increase the supplying current, and test mode setting signal (hereinafter simply referred to as "output signal") VPPSTP from internal node NDB rises, and finally reaches the external power supply voltage exVdd level.

When internal node NDB attains the external power supply voltage exVdd level and internal node NDA attains the ground voltage Vss level, MOS transistor PQ1 is turned off and MOS transistors NQ3 and NQ4 are turned off. Accordingly, in level conversion circuit 30, there is no path conducting a current from the external power supply node to the ground node, and output signal VPPSTP is held stably at the external power supply voltage exVdd level.

When input signal VPPSTPS is set to the ground voltage Vss level, MOS transistors NQ1 and NQ3 are in the turned off and on states, respectively. Accordingly, node NDB is discharged to the ground voltage level, while node NDA is charged to the external power supply voltage exVdd level, and output signal VPPSTP is held at the ground voltage level.

When the voltage level of node NDA or NDB is pulled up, MOS transistors NQ2 and NQ4 each comes to have a sufficiently small current driving power, and the CMOS inverter formed of MOS transistors PQ1 and NQ2 and that formed of MOS transistors PQ2 and NQ4 are made sufficiently smaller in latching capability, and by MOS transistors NQ1 and NQ3, the latching state by these CMOS inverters can be readily inverted.

A state in the deep power down mode with peripheral power supply voltage Vddp being cut off will now be considered. In addition, a state in which peripheral power supply voltage Vddp has power supply noise superimposed thereon and input signal VPPSTPF and the voltage level at node NDF is in an electrically floating state, will also be considered. In this case, MOS transistors NQ2 and NQ4 form CMOS inverters with MOS transistors PQl and PQ2, respectively, to configure an inverter latch. Accordingly, one of internal nodes NDA and NDB is reliably fixed at an L level to prevent internal nodes NDA and NDB both from attaining an intermediate voltage level.

With the amount of a drive current of MOS transistors NQ1 and NQ3 due to the floated voltage of input signal VPPSTPF or node NDF taken into consideration, MOS transistors PQ1 and PQ2 have their sizes adjusted to sufficiently adjust their current driving capabilities. Even if input signal VPPSTPF or the voltage level at node NDF electrically floats, internal node NDA or NDB can be fully prevented from transitioning to an intermediate voltage level, and the latching state can be maintained to suppress a through current sufficiently. There is only a small current flowing in an internal node of an H level via MOS transistor NQ1 or NQ3 that are set in a weak turned on state due to voltage floating up in input signal VPPSTPF or node NDF.

Thus, even if level conversion circuit 30 has a path formed to pass a through current from the external power supply node to the ground node, a through current due to floating in signal potential is merely generated in an internal node storing an H level of the external power supply voltage exVdd level. Internal nodes NDA and NDB can both be prevented from attaining an intermediate potential level to cause a through current flowing through both paths. A sufficiently reduced through current can be implemented and the latching state of level conversion circuit 30 can sufficiently be maintained.

Thus, in accordance with the first embodiment of the present invention, a level conversion circuit is provided, at internal nodes outputting complementary voltage signals, with a latch circuit (MOS transistors NQ2, NQ4) pulling down to an L level. When supply of a peripheral power supply voltage or other is interrupted, even if the voltage level at an internal node electrically floats up, a through current flowing from an external power supply node to a ground node can be suppressed, and a latching state can also be maintained.

Second Embodiment

Figure 7:
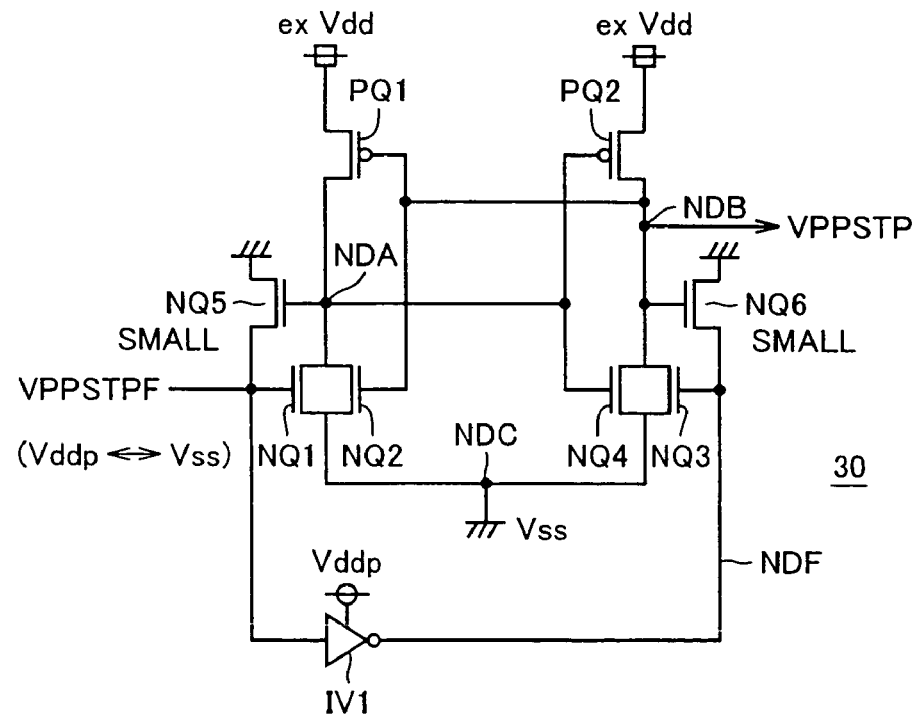
FIG. 7 shows a configuration of a level conversion circuit according to a second embodiment of the present invention.

FIG. 7 shows a configuration of a level conversion circuit according to a second embodiment of the present invention. In FIG. 7, a level conversion circuit is different from level conversion circuit shown in FIG. 6 in configuration in the following points. There are provided an N channel MOS transistor NQ5 for driving input signal VPPSTPF to the ground voltage level in according with a voltage level of internal node NDA, and an N channel MOS transistor NQ6 for driving output node NDF of inverter IV1 to the ground voltage level in accordance with a voltage level of internal node NDB. MOS transistors NQ5 and NQ6 each have a size (W/L) set to substantially the same as MOS transistors NQ2 and NQ4 and thus sufficiently made small.

The other configuration of level conversion circuit shown in FIG. 7 is identical to that of the level conversion circuit shown in FIG. 6. Therefore, corresponding portions are denoted by like reference characters and their detailed description will not be repeated.

In the level conversion circuit shown in FIG. 7, when internal node NDA is at the external power supply voltage exVdd level, MOS transistor NQ5 is conductive and input signal VPPSTPF is held at the ground voltage level. Input signal VPPSTPF is at an L level and has its voltage level simply latched by MOS transistor NQ5. Similarly, MOS transistor NQ6 also drives output node NDF of inverter IV1 to the ground voltage level when internal node NDB is at the external power supply voltage exVdd level. In this case, inverter IV1 also outputs a signal at an L level and MOS transistor NQ6 latches the signal outputted from inverter IV1.

A condition in which peripheral power supply voltage Vddp is cut off and input signal VPPSTPF and output node NDF of inverter IV1 both enter an electrically floating state will now be considered. A condition where internal node NDB is at the external power supply voltage exVdd level and internal node NDA is at the ground voltage level will now be considered specifically. When peripheral power supply voltage Vddp is cut off and input signal VPPSTPF and output node NDF of inverter IV1 have the voltage levels electrically floated, node NDA is held at the ground voltage level by MOS transistor NQ2, to be prevented from electrically floating. Similarly, at node NDB, even if MOS transistor NQ3 has a raised gate potential, MOS transistor NQ6, kept conductive in accordance with a voltage level of the H level on node NDB, absorbs a rise in voltage on node NDF and fixes node NDF to the ground voltage level. Therefore, MOS transistor NQ3 is held non-conductive, ensuring that a path of a through current from the external power supply node to the ground node is cut off. Since node NDB is fixed at the ground voltage level, MOS transistor PQ1 holds the off state, to reliably cut off a path passing a through current via node NDA from the external power supply node to the ground node.

Even if a leakage current path (a junction leakage current path) is formed via MOS transistor PQ1 from the external power supply node to node NDA through a substrate region of MOS transistor PQ1 and other, MOS transistor NQ2 can discharge the leakage current to prevent an increase in potential of node NDA to reliably prevent the inversion of latching state at nodes NDA and NDB.

As shown in FIG. 7, providing MOS transistors NQ5 and NQ6 to provide a latching MOS transistor for latching input signal VPPSTPF or a voltage of node NDF ensures the cut off of a path of a through current even when supply of the peripheral power supply voltage is shut down and MOS transistors NQ1 and/or NQ3 have/has a gate potential electrically floating. A reduced current consumption can thus be achieved. Furthermore, in level conversion circuit 30, a latching state is reliably maintained to maintain the logic level of signal VPPSTP upon transition of a mode to the deep power down mode. An internal circuit can thus be prevented from erroneously operating.

As described so far, in accordance with the second embodiment of the present invention, an input signal and a potential of an output node of an inverter can be latched in accordance with a potential of an internal node outputting an output signal, to ensure the cut off of a path passing a through current upon shut down of a peripheral power supply, an increase in current consumption can be avoided, and a latching state can be maintained reliably.

Third Embodiment

Figure 8:
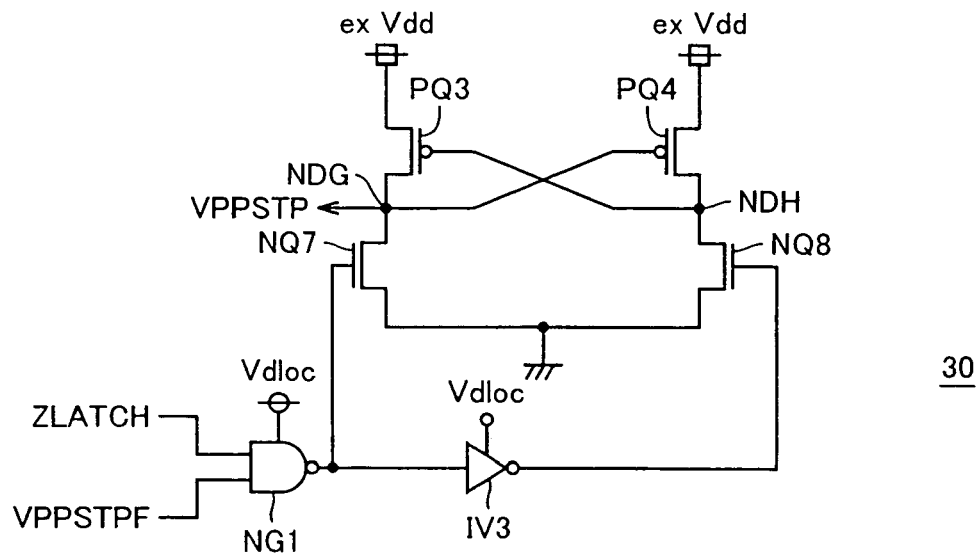
FIG. 8 shows a configuration of a level conversion circuit according to a third embodiment of the present invention.

FIG. 8 shows a configuration of level conversion circuit 30 according to a third embodiment of the present invention. In FIG. 8, level conversion circuit 30 includes an NAND gate NG1 receiving a latch instruction signal ZLATCH and input signal VPPSTPF, and an inverter IV3 receiving a signal outputted from NAND gate NG1. NAND gate NG1 and inverter IV3 receive, as an operating power supply voltage, a local peripheral power supply voltage Vdloc normally generated via path different from the path of peripheral power supply voltage Vddp. Local peripheral power supply voltage Vdloc has the same voltage level (for example, of 2.5V) as peripheral power supply voltage Vddp.

Level conversion circuit 30 further includes a P channel MOS transistor PQ3 connected between an external power supply node and an internal node NDG and having its gate connected to an internal node NDH, a P channel MOS transistor PQ4 connected between an external power supply node and node NDH and having its gate connected to node NDG, an N channel MOS transistor NQ7 connected between node NDG and a ground node and receiving, at its gate, a signal outputted from NAND gate NG1, and an N channel MOS transistor NQ8 connected between node NDH and a ground node and receiving at its gate a signal outputted from inverter IV3. Internal node NDH outputs an output signal VPPSTP. This level conversion stage has a configuration similar to that of a conventional latch-type level shift circuit.

Latch instruction signal ZLATCH is activated in accordance with a command instructing the power down mode, at a timing faster than shut down of the peripheral power supply circuit. In the level conversion circuit shown in FIG. 8, in the power down mode, latch instruction signal ZLATCH changes to an L level, NAND gate NG1 outputs a signal fixed to the L level, and inverter IV3 outputs a signal fixed at an H level. Therefore, if input signal VPPSTPF attains an uncertain state in the power down mode, the latch-type level shift circuit portion fixes the voltage level of an input signal and output signal VPPSTP can be maintained stably without producing a through current. Furthermore, latch instruction signal ZLATCH fixed in the power down mode to the L level ensures the cut off of a through current in NAND gate NG1 even if input signal VPPSTPF enters an uncertain state, to fix its output signal to the H level (the voltage Vdloc level). (In NAND gate NG1, between an internal output node and a ground node, N channel MOS transistors receiving latch instruction signal ZLATCH and input signal VPPSTPF at gates are connected in series.)

Figure 9:
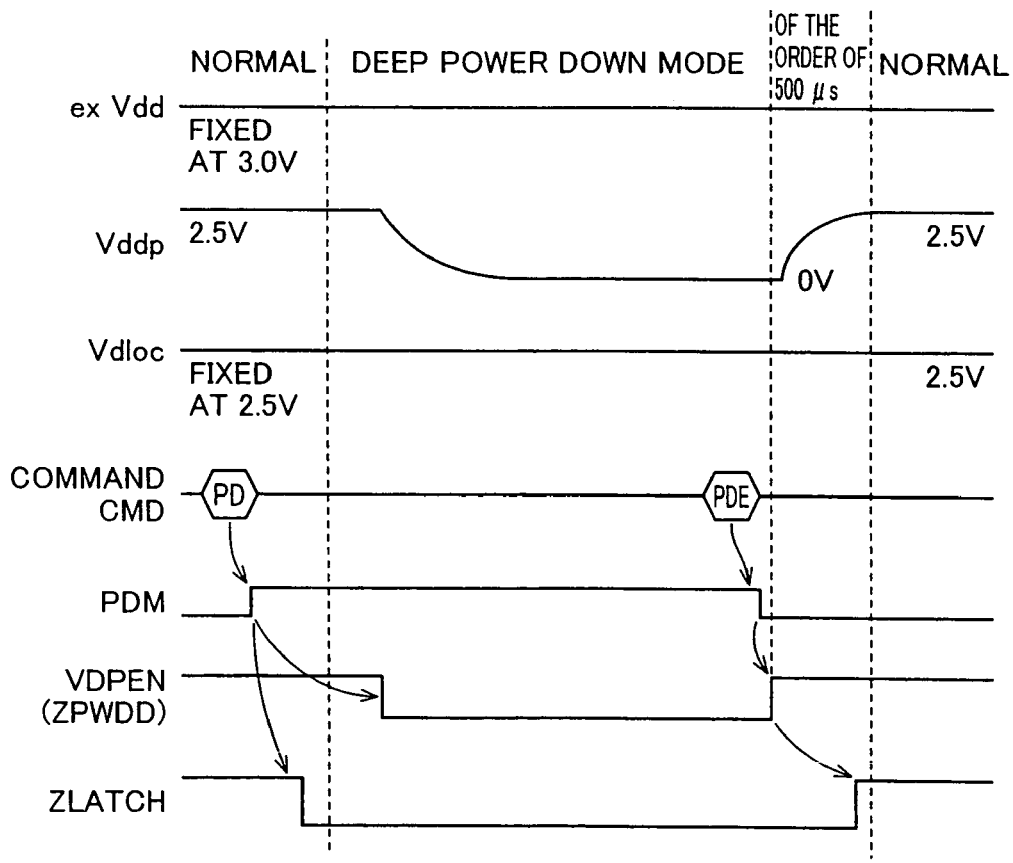
FIG. 9 illustrates a control signal generation sequence for the level conversion circuit shown in FIG. 8.

FIG. 9 is a timing diagram illustrating a transition of the control signal and power supply voltage in the power down mode shown in FIG. 8. Now, with reference to FIG. 9, variation of each control signal and power supply voltage shown in FIG. 8 will simply be described.

Regardless of a normal mode of operation or the deep power down mode, external power supply voltage exVdd is fixed at a constant voltage level (3.0V) and local peripheral power supply voltage Vdloc is also fixed at the same voltage level (of 2.5V) as peripheral power supply voltage Vddp.

When the deep power down mode is entered, firstly, as an external command CMD, a power down mode command PD is provided and internally a power down mode signal PDM is activated. In response to power down mode signal PDM, latch instruction signal ZLATCH is driven to the L level of an active state. After a prescribed period of time has elapsed, in response to power down mode signal PDM, a peripheral power supply enable signal VDPEN activating an operation of generating peripheral power supply voltage Vddp is set into an inactive state. (Peripheral power supply enable signal VDPEN corresponds to deep power down mode instructing signal ZPWDD indicated in FIG. 3.)

When the deep power down mode is entered, the generation of peripheral power supply voltage Vddp is stopped and accordingly its voltage level drops ultimately to substantially 0V.

To exit from the deep power down mode, a power down mode exit command PDE is applied to set power down mode signal PDM to the L level. In response to power down mode instructing signal PDM being inactive, peripheral power supply enable signal VDPEN is first driven to the active state. Subsequently, a latch instruction signal ZLATCH is driven to the H level of the inactive state. Latch instruction signal ZLATCH is activated when peripheral power supply voltage Vddp is stabilized and input signal VPPSTPF is not in an uncertain state but is in a stable state. Typically, when the deep power down mode shifts to the normal mode of operation, a time period of the order of 500 µs is required to stabilize the peripheral power supply voltage.

As shown in FIG. 9, latch instruction signal ZLATCH is activated when peripheral power supply voltage Vddp is in a stable state, and a signal outputted from NAND gate G1 is fixed, to cut off a through current path in NAND gate NG1. Then, a generation operation of peripheral power supply voltage Vddp is stopped. This allows the latching state of the level conversion circuit to be maintained in the deep power down mode.

In exit from the deep power down mode, peripheral power supply voltage enable signal VDPEN is first activated to drive the voltage level of peripheral power supply voltage Vddp to a prescribed voltage level. When peripheral power supply voltage Vddp stabilizes and there is no possibility that input signal VPPSTPF enters an uncertain state, latch instruction signal ZLATCH is inactivated. This ensures that an input node in level conversion circuit 30 can be prevented from entering an uncertain state, to suppress a through current, and to prevent a latching state from varying.

Figure 10:
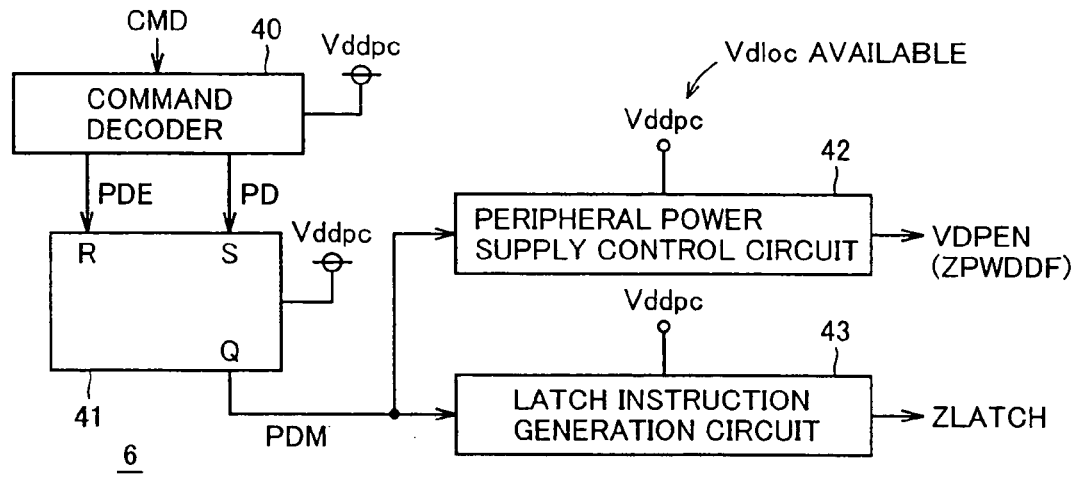
FIG. 10 shows an example of a configuration of a portion for generating a control signal shown in FIG. 9.

FIG. 10 shows an example of a configuration of a portion for generating latch instruction signal ZLATCH and peripheral power supply enable signal VDPEN indicated in FIG. 8. The configuration shown in FIG. 10 is included in control circuit 6 shown in FIG. 1.

In FIG. 10, control circuit 6 includes a command decoder 40 for decoding an external command CMD to generate power down mode signal PD and power down mode exit signal PDE in accordance with a result of decoding, a flip-flop 41 set and reset in response to power down mode signal PD and power down mode exit signal PDE, respectively, outputted from command decoder 40, and outputting power down mode signal PDM at an output Q, a peripheral power supply control circuit 42 responsive to power down mode signal PDM, for generating peripheral power supply enable signal PDPEN, and a latch instruction generation circuit 43 responsive to power down mode signal PDM, for generating latch instruction signal ZLATCH.

Command decoder 40, set/reset flip-flop 41, peripheral power supply control circuit 42 and latch instruction generation circuit 43 each receive the controlling, peripheral power supply voltage Vddpc as an operating power supply voltage. Voltage Vddpc may be local peripheral power supply voltage Vdloc.

Peripheral power supply control circuit 42 is configured, for example, of a delay circuit for delaying the rising of power down mode signal PDM by a prescribed period of time, and latch instruction generation circuit 43 is configured, for example, of a delay circuit for delaying the falling of power down mode signal PDM. Peripheral power supply control circuit 42 and latch instruction generation circuit 43 may be configured of a flip-flop set/reset in response to power down indication signal PD and power down mode exit signal PDE outputted from command decoder 40. (To adjust a timing of activation of an output signal, a delay circuit is provided for a set input or a reset input).

Peripheral power supply control circuit 42 outputs peripheral power supply enable signal VDPEN, which has an amplitude of voltage Vddpc, and, as shown in FIG. 4, is converted via a level conversion circuit to a signal of the external power supply voltage exVdd level to be applied to the peripheral power supply circuit. Peripheral power supply control circuit 42 corresponds to mode detection circuit 25 shown in FIG. 4. Furthermore, peripheral power supply enable signal VDPEN corresponds to deep power down mode instructing signal ZPWDDF.

Figure 11:
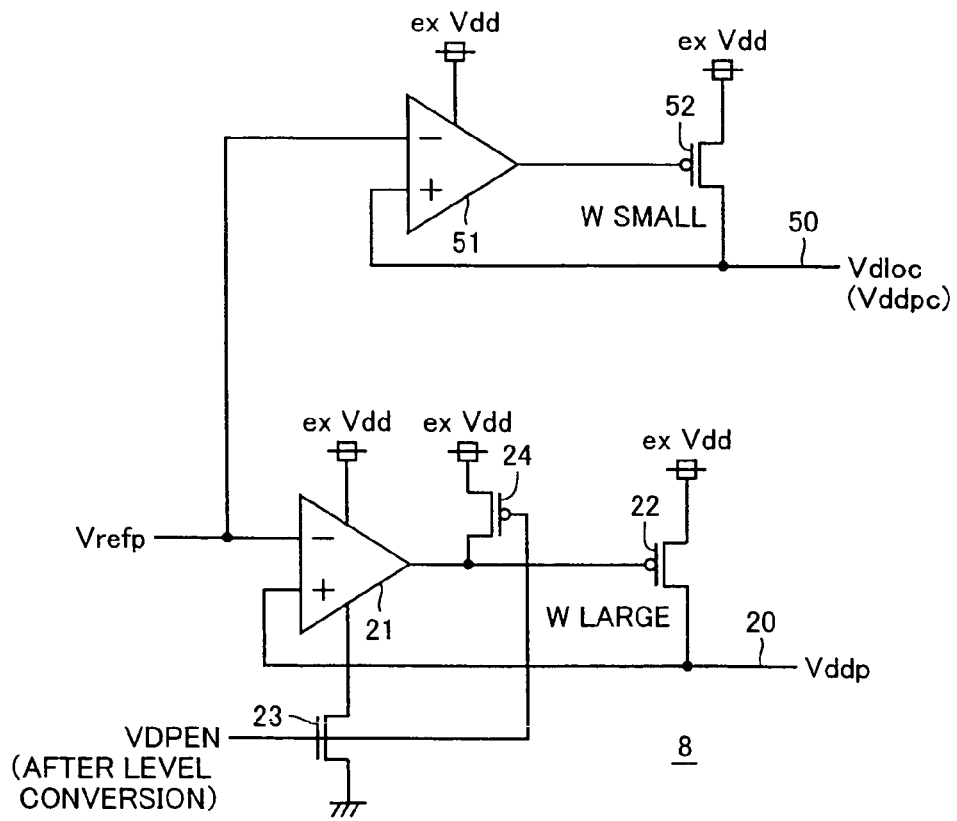
FIG. 11 shows an example of a configuration of a local peripheral power supply voltage generation portion shown in FIG. 8.

FIG. 11 shows, by way of example, a configuration of a portion for generating local peripheral power supply voltage Vdloc shown in FIG. 8. In FIG. 11, in internal voltage generation circuit 8 shown in FIG. 1, in addition to the configuration of the peripheral power supply circuit for generating peripheral power supply voltage Vddp shown in FIG. 3, there is provided a comparison circuit 51 for comparing local peripheral power supply voltage Vdloc on a local peripheral power supply line 50 with reference voltage Vrefp and a current drive transistor 52 formed of a P channel MOS transistor and responsive to a signal outputted from comparison circuit 51, for supplying a current on local peripheral power supply line 50. Comparison circuit 51 receives external power supply voltage exVdd as an operating power supply voltage, and normally operates to perform a comparison operation for generating local peripheral power supply voltage Vdloc.

The portion for generating peripheral power supply voltage Vddp is the same in configuration as the peripheral power supply voltage generation circuit shown in FIG. 3. It should be noted, however, that as a signal that controls activation/inactivation of generation of a voltage, peripheral power supply enable signal VDPEN (after level conversion) is applied in place of deep power down mode instructing signal ZPWDD. As for the portion generating peripheral power supply voltage Vddp, the same components as those shown in FIG. 3 are identically labeled, and will not be described in detail.

Local peripheral power supply voltage Vdloc is merely utilized as a power supply voltage for NAND gate NG1 and inverter IV3 in the level conversion circuit 30 shown in FIG. 8 and its current driving power is made sufficiently small. In contrast, peripheral power supply voltage Vddp, supplied to a large number of other circuit components such as the control circuit, and the circuitry peripheral to the memory array, and has its current driving power made sufficiently lager. Accordingly, current drive transistor 22 has channel width W made sufficiently large, while current drive transistor 52 has channel width W made sufficiently small to have its current driving power sufficiently reduced.

By utilizing the configuration shown in FIG. 11, a voltage the same in voltage level as peripheral power supply voltage Vddp can also be generated as peripheral power supply voltage Vdloc in the deep power down mode with reduced current consumption.

It is noted that peripheral power supply voltage Vdloc shown in FIG. 11 may be supplied as power supply voltage Vddpc to a command control circuit included in control circuit 6.

As described so far, according to the third embodiment of the present invention, in an operation mode in which an input signal enters an uncertain state, a logic level of the input signal for a level conversion circuit is fixed by a latch instruction signal. Thus, even when power supply is interrupted and the input signal enters an uncertain state, the input signal to the level conversion circuit can be fixed at a constant voltage level to reduce a through current and accurately maintain the latching state of the level conversion circuit.

It is noted that the level conversion circuit of the first or second embodiment may be used in the level conversion stage.

Fourth Embodiment

Figure 12:
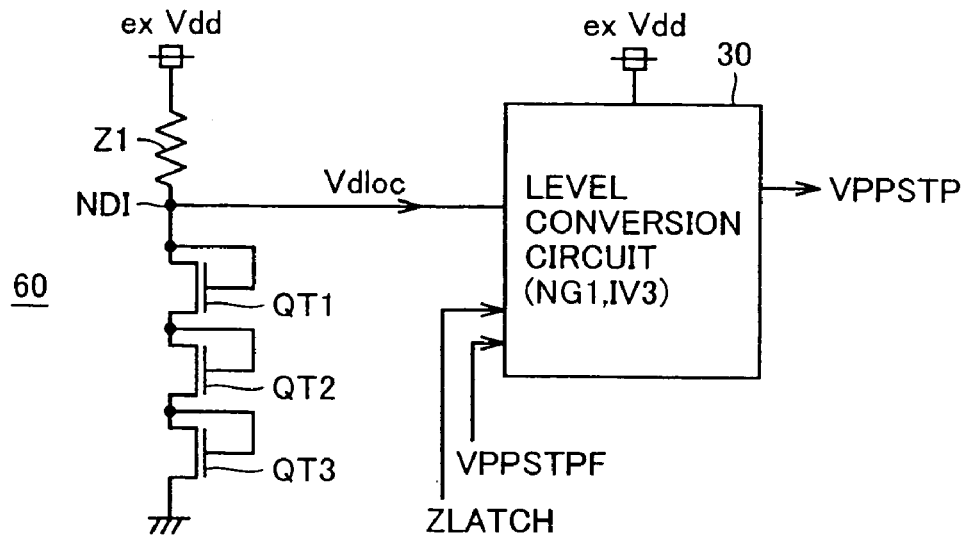
FIG. 12 schematically shows a configuration of a main portion of a semiconductor device according to a fourth embodiment of the present invention.

FIG. 12 schematically shows a configuration of a main portion of a semiconductor device according to a fourth embodiment of the present invention. In the configuration shown in FIG. 12, a level conversion circuit 30 has the configuration shown in FIG. 8, and includes NAND gate ND1 and inverter IV3. This level conversion circuit 30, as in the configuration shown in FIG. 8, receives input signal VPPSTPF and latch instruction signal ZLATCH to generate output signal VPPSTP of an amplitude of the external power supply voltage exVdd level.

Level conversion circuit 30 is arranged in neighborhood of a local peripheral power supply circuit 60 generating local peripheral power supply voltage Vdloc. Local peripheral power supply circuit 60 includes a resistance element Z1 of high resistance connected between an external power supply node and a node ND1, and N channel MOS transistors QT1-QT3 each diode-connected and connected in series between node NDI and a ground node. Resistance element Z1 of local peripheral power supply circuit 60 has a sufficiently large resistance value and has its current driving power made sufficiently small. Local peripheral power supply voltage Vdloc is generated from node NDI and has a voltage level of 3·Vth, wherein Vth represents a threshold voltage of each of MOS transistors QT1-QT3, and is, for example, 0.8V. Accordingly, local peripheral voltage Vdloc assumes 2.4V, a voltage level substantially the same as peripheral power supply voltage Vddp, or 2.5V, and local peripheral power supply voltage Vdloc has a voltage level lower than peripheral power supply voltage Vddp. Thus, in the normal mode of operation, level conversion circuit 30 can perform a level conversion operation accurately in accordance with input signal VPPSTPF of an amplitude of the peripheral power supply voltage Vddp level.

Local peripheral power supply circuit 60 is not required to have a significant current driving power, and can accordingly be arranged in a vicinity of level conversion circuit 30 to reduce the length of an interconnection line for local peripheral power supply voltage Vdloc. A local power supply voltage of a desired voltage level can be transmitted without a voltage drop due to an interconnection line resistance. Furthermore, as local peripheral power supply circuit 60 is not required to have a large current driving power, a transistor size can be sufficiently reduced, to implement a sufficiently reduced circuit layout area.

As described so far, according to the fourth embodiment of the present invention, a circuit supplying a power supply voltage to a gate circuit included in the level conversion circuit for fixing a potential in the deep power down mode is exclusively arranged in the vicinity of level conversion circuit 30. A local peripheral power supply voltage of a desired voltage level can be generated and supplied with a small occupied area and reduced power consumption.

Fifth Embodiment

Figure 13:
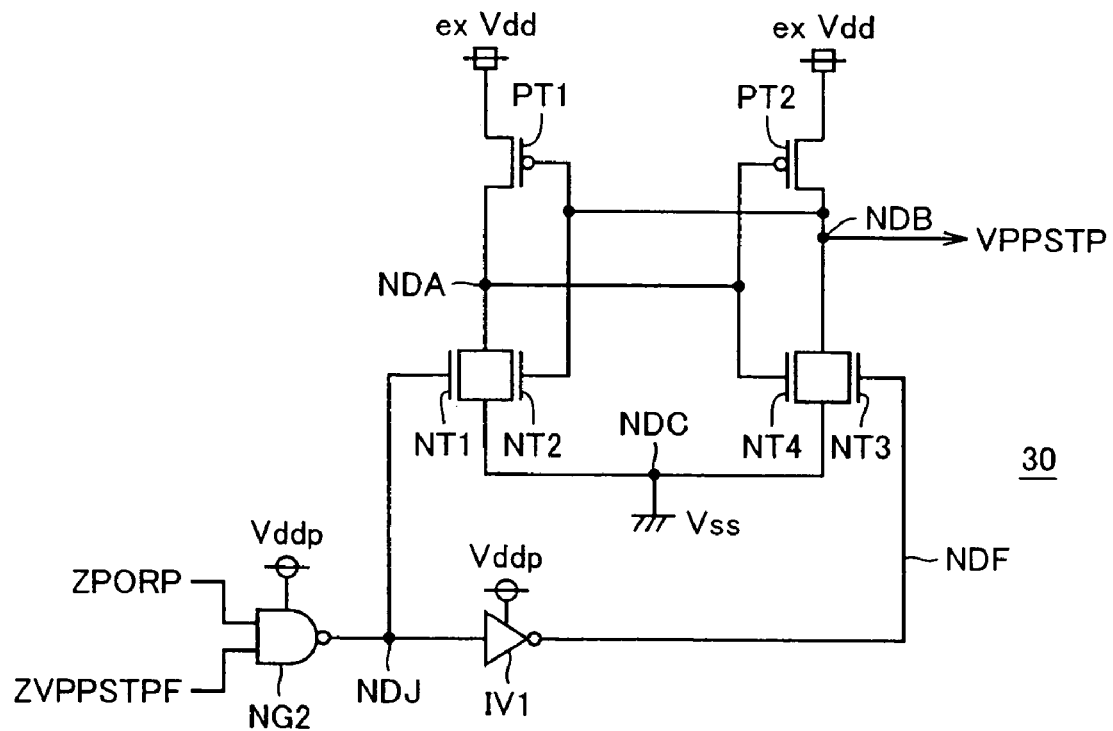
FIG. 13 shows a configuration of a level conversion circuit according to a fifth embodiment of the present invention.

FIG. 13 shows a configuration of a level conversion circuit according to a fifth embodiment of the present invention. The configuration of level conversion circuit shown in FIG. 13 is different from the configuration of the level conversion circuit shown in FIG. 6 in the following points. MOS transistor NQ1 has a gate receiving a signal outputted from an NAND gate NG2 receiving a signal ZPORP indicating that a peripheral power supply voltage is powered up, and an input signal ZVPPSTPF. The signal outputted from NAND gate NG2 is applied via inverter IV1 to a gate of MOS transistor NQ3. NAND gate NG2 receives peripheral power supply voltage Vddp as an operating power supply voltage. Input signal ZVPPSTPF is an inverted signal of input signal VPPSTPF shown in FIG. 6. The other configuration of the level conversion circuit shown in FIG. 13 is identical to the level conversion circuit shown in FIG. 6. Accordingly, corresponding components are identically labeled and will not be described in detail.

Figure 14:
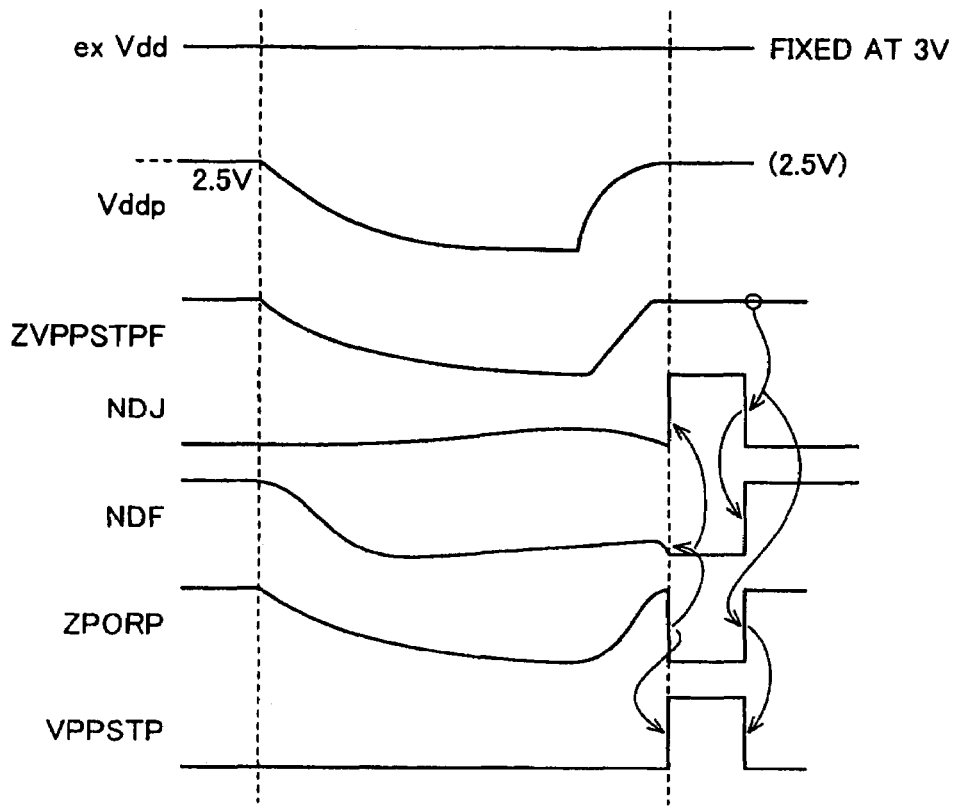
FIG. 14 is a signal waveform diagram representing an operation of the level conversion circuit shown in FIG. 13.

FIG. 14 is a signal waveform diagram representing an operation of the level conversion circuit shown in FIG. 13. With reference to FIG. 14, the operation of level conversion circuit shown in FIG. 13 will be described below.

When the deep power down is designated and peripheral power supply voltage Vddp is shut down, the input signal ZVPPSTPF lowers from an H level. Similarly, the peripheral power supply voltage Vddp voltage level also lowers. The peripheral power supply voltage power up detecting signal ZPORP is generated from a circuit using peripheral power supply voltage Vddp, and its voltage level drops from the H level to the ground voltage level. Accordingly, in NAND gate NG2, its input signal ZVPPSTPF and peripheral power supply voltage power up signal ZPORP both attain an uncertain state, and node NDJ may possibly have a voltage level raised due to a noise with the lowering of peripheral power supply voltage Vddp. Furthermore, the output signal from inverter IV1 also attains an uncertain state. In the condition shown in FIG. 14, node NDF has a voltage level of the H level before interruption of power supply, and as peripheral power supply voltage Vddp lowers, node NDF accordingly has a voltage level lowered similarly as input signal ZVPPSTPF does, or increased due to noise.

Even if nodes NDJ and NDF have their voltage levels both raised, level conversion circuit 30 still maintains a latching state similarly as in the configuration shown in FIG. 6, and its through current is suppressed, and an output signal VPPSTP maintains the L level.

When the deep power down mode completes and peripheral power supply voltage Vddp is powered up, the peripheral power supply voltage Vddp level rises and the peripheral power supply voltage power up detecting signal ZPORP level accordingly rises. When peripheral power supply voltage Vddp attains a prescribed voltage level and stabilizes, the peripheral power supply voltage power up detecting signal ZPORP transitions to the L level, NAND gate NG2 outputs a signal of the H level, and nodes DJ and NDF are initialized to the H and L levels, respectively.

Inverted input signal ZVPPSTPF is also initialized in accordance with the peripheral power supply voltage power up detecting signal ZPORP to the H level. When peripheral power supply voltage power up detecting signal ZPORP rises to the H level, the output signal from NAND gate NG2 attains again the L level, nodes NDJ and NDF are set to the L and H levels, respectively. Although output signal VPPSTP is at the H level while peripheral power supply voltage power up detecting signal ZPORP is at the L level, after completion of initialization operation, output signal VPPSTP is again maintained at the L level. During the initialization, internal operation is prohibited and there occurs no particular problem even if the generation of high voltage VPP is stopped for a prescribed period of time.

As shown in FIG. 14, upon exit from the power down of peripheral power supply voltage Vddp, internal nodes NDJ and NDF can once be set to a prescribed voltage level in accordance with peripheral power supply voltage power up detecting signal ZPORP, so that even if nodes NDJ and NDF in the power down state are in an uncertain state, node NDJ and NDF can be prevented from being driven to an erroneous voltage level to cause a changed latching state in the level conversion circuit 30 upon exit from the power down mode.

It is noted that in the level conversion circuit 30 shown from FIG. 13, upon power up of external power supply voltage exVdd, the latching state attains an uncertain state. Even in that case, when peripheral power supply voltage Vddp stabilizes after external power supply voltage exVdd is powered up, the power up detecting signal ZPORP is similarly generated, to ensure the initialization of the output signal VPPSTP to the L level after power up of external power supply voltage extVdd.

Figure 15:
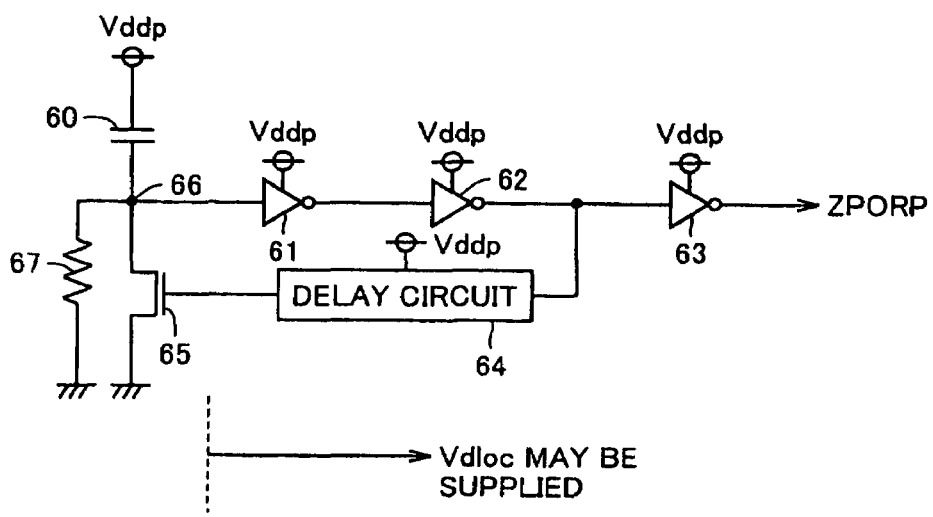
FIG. 15 shows an example of a configuration of a portion for generating a peripheral power up signal shown in FIG. 13.

FIG. 15 shows an exemplary configuration of the circuit detecting that a peripheral power supply voltage is powered up. In FIG. 15, the peripheral power supply voltage power up detecting circuit includes a capacitive element 68 coupled between a peripheral power supply node and a node 66, inverters 61-63 cascaded in three stages and coupled with node 66, a delay circuit 64 delaying, by a prescribed period of time, a signal outputted from inverter 62, an N channel MOS transistor 65 responsive to a signal outputted from delay circuit 64 to couple node 66 with a ground node, and a resistive element 67 of high resistance connected between node 66 and a ground node. Inverter 63 outputs the peripheral power supply voltage power up detecting signal ZPORP.

Inverters 61-63 and delay circuit 64 are each supplied with peripheral power supply voltage Vddp as an operating power supply voltage.

In normal operation, delay circuit 64 outputs a signal of the L level and MOS transistor 65 is in the off state. Node 66 is fixed, through resistive element 67 of high resistance, to the ground voltage level, and peripheral power supply voltage power up detecting signal ZPORP is at the H level.

Upon exit from the deep power down mode, when peripheral power supply voltage Vddp is supplied, delay circuit 64 still outputs a signal at the L level and node 66, with MOS transistor 65 being turned off, is coupled with the ground node via resistive element 67 of high resistance. Node 66 is substantially in an electrically floating state, and as a peripheral power supply voltage Vddp increases in voltage level, through the capacitive coupling of capacitive element 68, node 66 increases in voltage level. Inverter 62 outputs a signal rising with the rise of peripheral power supply voltage Vddp level. When inverter 62 outputs a signal exceeding an input logic threshold voltage of inverter 63, inverter 63 drives the output signal ZPORP to the L level.

Then, when a delay time provided by delay circuit 64 elapses, delay circuit 64 outputs a signal of the H level, MOS transistor 65 turns on, and node 66 is discharged to the ground voltage level, and in response, the outputs signal ZPORP from inverter 63 attains the H level. In accordance with the drop of the voltage level at node 66, delay circuit 64 outputs the signal of the L level. In response, MOS transistor 65 turns off. Thereafter, node 66 is maintained by resistive element 67 at the ground voltage level and the peripheral power supply voltage power up detecting signal ZPORP is maintained at the H level.

In the configuration of the peripheral power supply voltage power up detecting circuit shown in FIG. 15, inverters 61-63 and delay circuit 64 each may be supplied with local peripheral power supply voltage Vdloc as an operating power supply voltage. In this case, even in the power down mode, peripheral power supply voltage power up detecting signal ZPORP maintains the H level and when peripheral power supply voltage Vddp is powered up and node 66 increases in voltage level, peripheral power supply voltage power up detecting signal ZPORP is set at the L level for the delay time defined by delay circuit 64.

As described so far, according to the fifth embodiment of the present invention, an internal node of the level conversion circuit is initialized in accordance with a signal indicating the power up of a peripheral power supply voltage. The internal node can be prevented from entering an uncertain state to cause the latching state of the level conversion stage to enter an uncertain state upon initialization. This ensures the retention of the latching state of the level conversion circuit in the original state upon start of the operation.

Sixth Embodiment

Figure 16:
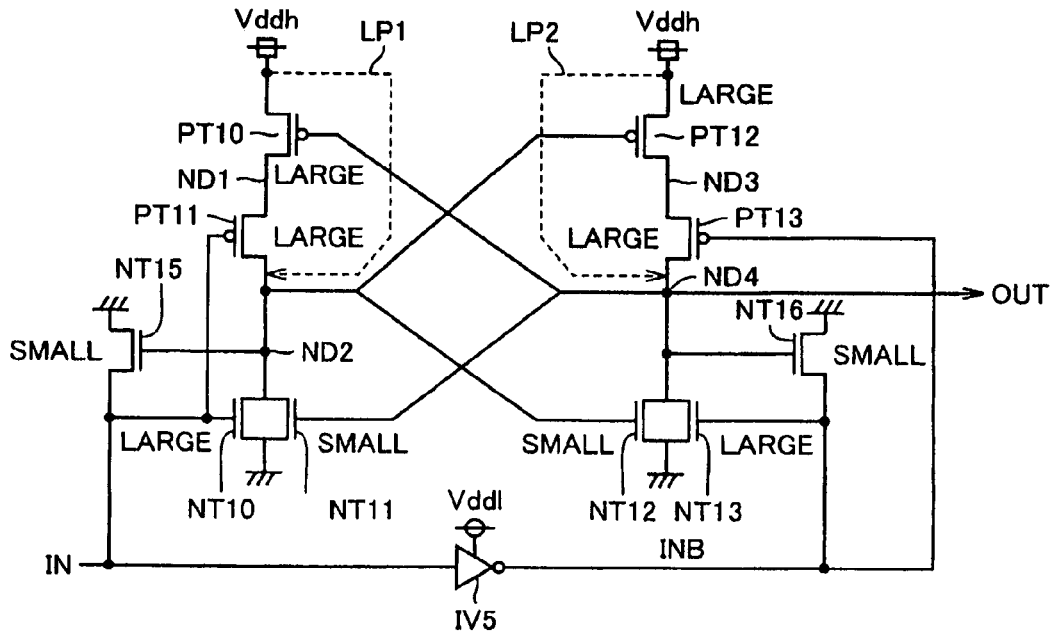
FIG. 16 shows a configuration of a level conversion circuit according to a sixth embodiment of the present invention.

FIG. 16 shows a configuration of a level conversion circuit according to a sixth embodiment of the present invention. In FIG. 16, this level conversion circuit converts an input signal IN of an amplitude of Vddl to an output signal OUT of an amplitude of Vddh. Voltage Vddh is higher than voltage Vddl. Therefore, as an example, voltage Vddh corresponds to external power supply voltage exVdd and voltage Vddl corresponds to peripheral power supply voltage Vddp. Input and output signals IN and OUT may be any signals to be level-converted, and in the sixth embodiment, are not limited to the signals VPPSTPF and VPPSTP.

In FIG. 16, the level conversion circuit includes a P channel MOS transistor PT10 connected between a power supply node and a node ND1 and having its gate connected to a node ND4, a P channel MOS transistor PT11 connected between nodes ND1 and ND2 and receiving input signal IN at its gate, and N channel MOS transistors NT10 and NT11 connected in parallel between a node NT1O and a ground node, MOS transistor NT10 receives input signal IN at its gate and MOS transistor NT11 has its gate connected to node NT4.

The level conversion circuit further includes a P channel MOS transistor PT12 connected between a power supply node and a node ND3 and having its gate connected to node ND2, a P channel MOS transistor PT13 connected between nodes ND3 and ND4 and receiving input signal IN at its gate via an inverter IV5, and N channel MOS transistors NT12 and NT13 connected in parallel between node ND4 and a ground node. MOS transistor NT12 has its gate connected to node ND2 and MOS transistor NT13 receives at its gate a signal INB outputted from inverter IV5.

The level conversion circuit further includes an N channel MOS transistor NT15 for coupling input signal IN with a ground node in accordance with a potential of node ND2, and an N channel MOS transistor NT16 to couple a signal INB outputted from inverter IV5 with a ground node in accordance with a potential of node ND4.

MOS transistors PT10, PT11, PT12, PT13, NT10 and NT13 each have a size (a channel-width to channel-length ratio or W/L) made sufficiently larger than that of each of MOS transistors NT11, NT12, NT15 and NT16. This relationship in size of the transistors is similar to that in the transistors shown in FIG. 6.

Figure 17:
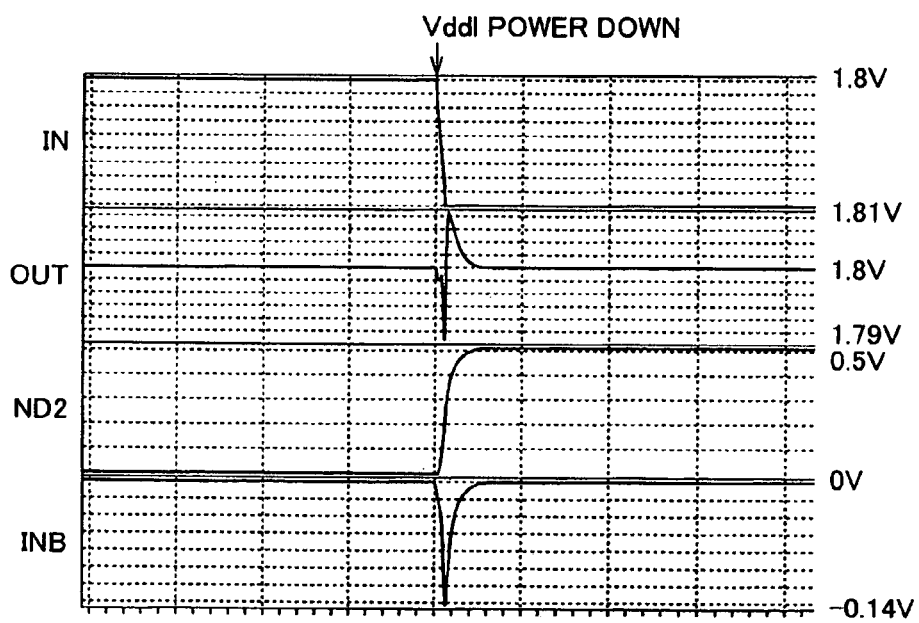
FIG. 17 is a timing diagram representing an operation of the level conversion circuit shown in FIG. 16.

FIG. 17 is a signal waveform diagram representing an operation of the level conversion circuit shown in FIG. 16 in a power cut mode. With reference to FIG. 17, an operation of the level conversion circuit shown in FIG. 16 will be described below. FIG. 17 shows, by way of example, a waveform in an operation with voltage Vddl being equal to voltage Vddh. In FIG. 17, the horizontal axis represents time and the vertical axis represents a voltage. Each signal voltage is measured with a different scale unit.

In normal operation, when input signal IN is at an H level (1.8V, for example), the node ND2 is discharged by MOS transistor NT10 to the ground voltage level and MOS transistors PT12 and NT12 are in turned on and off states, respectively. Furthermore, as inverter IV5 outputs signal INB of an L level, MOS transistors PT13 and NT13 are in turned on and off states, respectively. Thus, the signal OUT at node ND4 is charged by MOS transistors PT12 and PT13 to attain the voltage Vddh level.

Now it is assumed that under such condition, the power cut mode of cutting off the voltage Vddl is set. Input signal IN falls from the H level to the L level. In response, in inverter IV5, the output signal INB instantaneously drops and again rises to the ground voltage (0V) through capacitive coupling by the power supply line. As for output signal OUT, input signal IN drops to the L level and responsively MOS transistor NT12 is instantaneously turned on by a leakage current via MOS transistor PT11, to cause a power noise on output signal OUT. The power noises on output signals INB and OUT are 0.14V and 0.02V in amplitude, respectively, and are sufficiently small, but their waveforms are shown in FIG. 17 in a slightly exaggerated manner.

In MOS transistors PT10 and PT11, there exists a leakage current path LP1 via a substrate region, and in MOS transistors PT12 and PT13, there also exists a parasitic leakage path LP2 via the substrate region. When input signal IN is at the L level, MOS transistor PT11 is conductive, the leakage path LP1 in MOS transistor PT10 supplies a current via MOS transistor PT11 to node ND2 to raise its voltage level. MOS transistor NT11 is turned on in accordance with output signal OUT of the H level at node ND4, and discharges a leakage current of node ND2 with a small current driving power to prevent its voltage level from rising. In FIG. 17, node ND2 has a voltage level, for example, of the order of 0.5V, and is maintained at a voltage level equal to or less than a threshold voltage of N channel MOS transistor. MOS transistor NT16 is turned on by output signal OUT of the H level and fixes the signal INB outputted from inverter IV5 at the L level (the ground voltage level).

According to such arrangement, such a situation is prevented from occurring that in cutting off of the voltage Vddl, the signal INB outputted from inverter IV5 has the voltage level increased by a noise and MOS transistor NT13 discharges the leakage current through leakage path LP2 and the current through MOS transistors PT12 and PT13 with a large current driving power. A reduced current consumption can be achieved and nodes ND2 and ND4 can be prevented from approaching to a voltage level allowing a changing of the latching state. Output signal OUT can be reliably maintained at a prescribed high level.

Node ND2 has a voltage level determined by a relationship between a current driving power of MOS transistor NT11 and a leakage current supplied through leakage path LP1. Input signal IN is prevented from electrically floating by a sub-threshold leakage current of MOS transistor NT15 receiving a voltage of node ND2 at its gate. MOS transistor NT16 is in a strongly conductive state, to reliably maintain the output signal INB of inverter IV5 at the ground voltage level.

Thus, a path passing a through current from a power supply node to a ground node via MOS transistors PT12, PT13 and NT13 with a large current driving power can be cut off, and a reduced current consumption can be achieved. Furthermore, by suppressing an increase in potential of node NDA and fixing the signal INB outputted from inverter IV5 at the ground voltage, nodes ND2 and ND4 are prevented from having a reduced voltage difference to change the latching state of the level conversion circuit.

The voltage at node ND2 is supplied to the gate of MOS transistor NT12, and from node ND4 a leakage current flows to a ground node via MOS transistor NT12. However, MOS transistor NT12 has a gate potential lower than its threshold voltage, to cause a flow of sub-threshold leakage current, and has its current driving capability made sufficiently small. The through current can be sufficiently suppressed.

Furthermore, MOS transistors PT11 and PT13 can shorten the period of time for which a through current flows when input signal IN varies, and to change the output signal OUT rapidly. This is because when MOS transistor NT10 transitions to the on state, for example, MOS transistor PT11 is turned off, a current supplying path to node ND2 is cut off and node ND2 is rapidly discharged.

Thus, according to the sixth embodiment of the present invention, a P channel MOS transistor is provided between cross-coupled P channel MOS transistors for pulling up the output node, to cut off the current flow path in accordance with an input signal, and a MOS transistor with a small current driving power is provided at an output node, for discharging the leakage current. Therefore, in normal operation, an output signal can rapidly transition, and a through current can reliably be suppressed upon shut down of the power supply voltage. Furthermore, a latching MOS transistor is provided, which fixes the input signal to the ground potential level in accordance with the potential at the output node potential. Accordingly, electrical floating up of the input signal upon interruption of power supply can be prevented to prevent the inversion of the latching state and the generation of the through current.

Seventh Embodiment

Figure 18:
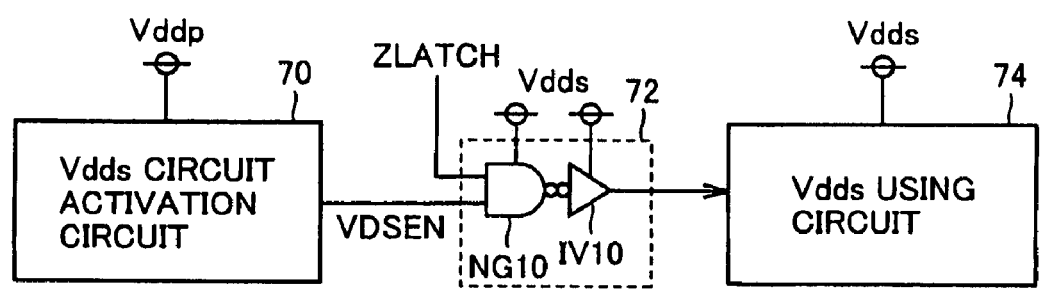
FIG. 18 schematically shows a configuration of a semiconductor device according to a seventh embodiment of the present invention.

FIG. 18 schematically shows a configuration of a main portion of a semiconductor device according to a seventh embodiment of the present invention. In FIG. 18, the semiconductor device includes a Vdds using circuit 74 receiving an array power supply voltage Vdds as an operating power supply voltage, and a Vdds circuit activation circuit 70 controlling the activation/inactivation of the operation of Vdds using circuit 74. Vdds circuit activation circuit 70 is supplied with peripheral power supply voltage Vddp as an operating power supply voltage.

Between Vdds circuit activation circuit 70 and Vdds using circuit 74, there is provided a fixing circuit 70 responsive to latch instruction signal ZLATCH for fixing a voltage level of its output signal. Fixing circuit 72 includes an NAND gate NG10 receiving latch instruction signal ZLATCH and an activation control signal VD SEN from Vdds circuit activation circuit 70, and an inverter IV10 receiving a signal from NAND gate NG10 to transmit the output signal to Vdds using circuit 74. NAND gate NG10 and inverter IV10 each receive array power supply voltage Vdds as an operating power supply voltage.

When peripheral power supply voltage Vddp is supplied, latch instruction signal ZLATCH is at an H level, Vdds using circuit 72 operates as a buffer circuit, and converts activation control signal VDSEN, having an amplitude of the peripheral power supply voltage Vddp level, received from Vdds circuit activation circuit 70 to a signal of an amplitude of the array power supply voltage Vdds level and outputs the converted signal.

When the supply of peripheral power supply voltage Vddp is interrupted, latch instruction signal ZLATCH is set to an L level, and fixing circuit 72 outputs a signal fixed to the L level. Under this state, at NAND gate NG10, a path of a through current flow is cut off regardless of the voltage level of activation control signal VDSEN, and even if activation control signal VDSEN enters an uncertain state, a through current can reliably be prevented from flowing and Vdds using circuit 74 can also be prevented from erroneously operating in accordance with the signal VDSEN in the uncertain state.

Vdds circuit activation circuit 70 and Vdds using circuit 74 can be considered, for example to form a portion, in a DRAM, for transmitting a sense enable signal generated from a sense amplifier activation circuit included in peripheral control circuitry to a sense enable transistor for supplying the array power supply voltage to the sense amplifiers. Voltages Vddp and Vdds are 2.5V and 2.0V, respectively and therefore close in voltage level, and furthermore, these circuits are placed in a path of transferring a signal from a circuit receiving a higher power supply voltage to a circuit receiving a lower power supply voltage, and a level shifter can be dispensed with. However, applying a latch instruction signal to fix a voltage level of a signal outputted from a circuit receiving peripheral power supply voltage Vddp as an operating power supply voltage ensures the prevention of flow of a through current even if an output signal from a circuit using peripheral power supply voltage Vddp attains an uncertain state, and thus, a circuit of a subsequent stage can be prevented from erroneous operation.

In the above description, a control signal is described to be used in a configuration of a test mode circuit for controlling the generation of high voltage Vpp. However, the present invention may be applied, for example, to a portion for generating a power cut signal for generating a control signal to interrupt the supply of an external power supply voltage to an input/output buffer circuit.

In addition, a signal changes between a ground voltage and an operating power supply voltage. However, a signal to be level-converted may be a signal changing between a negative voltage and an operating power supply voltage.

Furthermore, the semiconductor device is not limited to a DRAM and may be a different type of semiconductor memory device, or may be a semiconductor memory device having a general power down mode of interrupting the supply of a power supply voltage. The present invention is applicable to an interface between a circuit to which power supply is stopped and a circuit of a subsequent stage in the deep power down mode.

The present invention is generally applicable to semiconductor devices internally employing a plurality of power supply voltages and is applicable to semiconductor devices shutting down internally power supply voltage in a particular mode of operation to reduce power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
first circuitry receiving a first power supply voltage for outputting an internal signal having a first logic level corresponding to said first power supply voltage;
second circuitry receiving a second power supply voltage for converting said internal signal to a level-converted signal having said first logic level corresponding to said second power supply voltage; and
a third circuitry receiving said second power supply voltage and said level-converted signal, wherein
said second circuitry receives an instruction signal which is set to a second logic level lower than said first logic level when said first power supply voltage is interrupted, and outputs said level-converted signal which is set to said second logic level lower than said first logic level to said third circuitry, and
said first power supply voltage is higher than said second power supply voltage.

2. A semiconductor device comprising:
first circuitry receiving a first power supply voltage for outputting an internal signal having a first logic level corresponding to said first power supply voltage;
second circuitry receiving a second power supply voltage for converting said internal signal to a level-converted signal having said first logic level corresponding to said second power supply voltage; and
a third circuitry receiving said second power supply voltage and said level-converted signal, wherein
said second circuitry receives an instruction signal which is set to a second logic level lower than said first logic level when said first power supply voltage is interrupted, and outputs said level-converted signal which is set to said second logic level lower than said first logic level to said third circuitry, and
said first circuitry is a sense amplifier activation circuit receiving said first power supply voltage and said third circuitry is a sense amplifier receiving said second power supply voltage.

* * * * *